US007489112B2

(12) United States Patent
Ishikawa et al.

(10) Patent No.: US 7,489,112 B2
(45) Date of Patent: Feb. 10, 2009

(54) VOLTAGE DETECTING DEVICE (75) Inventors: Satoshi Ishikawa, Shizuoka (JP);
Hajime Okamoto, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 11/584,622

(22) Filed: Oct. 23, 2006

(65) Prior Publication Data

US 2007/0170889 A1 Jul. 26, 2007

(30) Foreign Application Priority Data

Jan. 20, 2006 (JP) ............................ 2006-012109

(51) Int. Cl.
*H02J 7/04* (2006.01)
*H02J 7/00* (2006.01)
*H01M 17/00* (2006.01)

(52) U.S. Cl. ...................... 320/161; 320/104; 320/152; 701/29

(58) Field of Classification Search ................. 320/152, 320/104, 161; 903/907; 701/29
See application file for complete search history.

(56) References Cited

U.S. PATENT DOCUMENTS 6,422,331 B1 * 7/2002 Ochiai et al. ............... 180/65.2

FOREIGN PATENT DOCUMENTS

JP 2003-243044 * 8/2003

* cited by examiner

*Primary Examiner*—Akm Enayet Ullah
*Assistant Examiner*—Yalkew Fantu
(74) *Attorney, Agent, or Firm*—Kratz, Quintos & Hanson, LLP (57) ABSTRACT

A voltage detecting device for an on-vehicle high-voltage battery in which secondary batteries are connected in series, the on-vehicle high-voltage battery being divided into blocks each including at least one secondary battery, includes: voltage detecting means each assigned to each block for detecting a voltage of each secondary battery included in the block; and control means for controlling the voltage detecting means, wherein a common secondary battery is selected from the secondary batteries, a voltage of the common secondary battery being detectable by two voltage detecting means, wherein the control means causes the two voltage detecting means to detect the voltage of the common secondary battery, computes a detection error between the two voltage detecting means from the detected voltage values of the common secondary battery, and makes corrections in voltage values detected by the two voltage detecting means on the basis of the computed detection error.

8 Claims, 4 Drawing Sheets

VOLTAGE DETECTING DEVICE

BACKGROUND OF THE INVENTION (1) Field of the Invention

The present invention relates to a voltage detecting device, particularly to a voltage detecting device for detecting a voltage across a plurality of secondary batteries connected in series, which constitute an on-vehicle high-voltage battery.

(2) Description of the Related Art

Recently, a hybrid electric-internal combustion vehicle (hereinafter, HEV), which travels by using both an engine and an electric motor, has been widely used. The HEV has two kinds of batteries consisting of a low-voltage (such as about 12V) battery for starting an engine and a high-voltage battery for driving an electric motor. The high-voltage battery provides a high voltage by connecting a plurality of secondary batteries such as nickel-hydrogen batteries or lithium batteries, each said secondary battery being an electric cell or a unit cell.

As for the high-voltage battery described above, a voltage of each secondary battery, that is, a state of charge (hereinafter, SOC) of each secondary battery varies widely (i.e. becomes uneven) while the secondary battery repeats charge and discharge. During the charge and discharge of the secondary battery, from the viewpoints of durability and safety of each secondary battery, it is necessary to inhibit the charge at a time point when the secondary battery having the highest SOC reaches a predetermined upper limit SOC and to inhibit the discharge at a time point when the secondary battery having the lowest SOC reaches a predetermined lower limit SOC. Accordingly, when the SOC of each secondary battery becomes uneven, a usable capacity of the secondary battery is substantially reduced. That is, as for the HEV, this undesirable phenomenon makes so-called an assist and regeneration insufficient, wherein the assist means a supplement of battery energy with respect to gasoline upon hill-climbing and the regeneration means regeneration of energy to the battery, thereby causing deterioration in a vehicle dynamic characteristic or fuel efficiency. Therefore, it becomes necessary to detect a voltage of each secondary battery in order to equalize the SOC of each secondary batter.

So far, as a voltage detecting device which detects a voltage of each secondary battery that is a component of the high-voltage battery described above, a device disclosed in Japanese Patent Application Laid-Open No. 2003-243044 has been proposed. In this voltage detecting device, a high-voltage battery is divided into a plurality of modules and a voltage of each secondary battery in each module is detected by a central processing unit (hereinafter, CPU) disposed per module. With such a construction, voltage values across a plurality of respective secondary batteries can be detected simultaneously and a withstanding voltage of an element that is used to detect the voltage of the secondary battery can be reduced.

In the conventional voltage detecting device described above, due to unevenness of a reference voltage used for detecting a voltage of each module and unevenness of accuracy of an A/D converter, a detection error takes place among the modules. If the detection error among the modules is large, an equalizing error takes place when the SOC of each secondary battery is equalized and therefore, each secondary battery could not be used efficiently. If high-accuracy reference voltage and high-accuracy A/D converter are used, this error can be removed. However, in such a case, it is necessary to have high-accuracy reference voltage and high-accuracy A/D converter for the respective modules, thereby causing a cost-up.

SUMMARY OF THE INVENTION

It is therefore an objective of the present invention to solve the above problem and to provide a voltage detecting device, by which when secondary batteries connected in series is divided into a plurality of modules (i.e. blocks) and a voltage of each secondary battery in each module is detected by a CPU disposed per module, the detection error of the detected voltage among the respective modules can be corrected with a low cost.

In order to attain the above objective, the present invention is to provide a voltage detecting device for an on-vehicle high-voltage battery in which a plurality of secondary batteries are connected in series, the on-vehicle high-voltage battery being divided into a plurality of blocks each including at least one secondary battery, the voltage detecting device including:

a plurality of voltage detecting means each assigned to each block for detecting a voltage of each secondary battery included in the block; and control means for controlling a plurality of the voltage detecting means, wherein a common secondary battery is selected from a plurality of the secondary batteries, a voltage of the common secondary battery being detectable by both two voltage detecting means assigned to respective blocks different from one another, wherein the control means causes the two voltage detecting means to detect the voltage of the common secondary battery, computes a detection error between the two voltage detecting means on the basis of the detected voltage values of the common secondary battery, and makes corrections in voltage values detected by the two voltage detecting means on the basis of the computed detection error.

With the construction described above, since a relative error between the respective voltage detecting means is computed and the corrections can be carried out on the basis of the relative error, therefore even if a high-accuracy reference voltage and high-accuracy A/D converter are not used in the voltage detecting means, an equalizing error of each secondary battery can be removed with a low cost and each secondary battery can be used efficiently.

Preferably, the control means computes the detection error between the two voltage detecting means consisting of first and second voltage detecting means by subtracting the voltage value of the common secondary battery detected by the second voltage detecting means from the voltage value of the common secondary battery detected by the first voltage detecting means.

With the construction described above, the detection error between the two voltage detecting means adjacent to each other can be computed easily.

Preferably, the control means subtracts the detection error between the two voltage detecting means from a voltage value of each secondary battery of the block detected by the first voltage detecting means that is assigned to the block, thereby making corrections in the voltage value of each secondary battery except the common secondary battery detected by the first voltage detecting means.

With the construction described above, having the one voltage detecting means as a criterion, a voltage value detected by the other voltage detecting means is corrected, so that a correction of a relative detection error between the voltage detecting means can be carried out.

Preferably, the control means adds the detection error between the two voltage detecting means to a voltage value of each secondary battery of the block detected by the second voltage detecting means that is assigned to the block, thereby making corrections in the voltage value of each secondary battery except the common secondary battery detected by the second voltage detecting means.

With the construction described above, having the other voltage detecting means as a criterion, a voltage value detected by the one voltage detecting means is corrected, so that a correction of a relative detection error between the voltage detecting means can be carried out.

DESCRIPTION OF THE PREFERRED EMBODIMENTS

Figure 1:
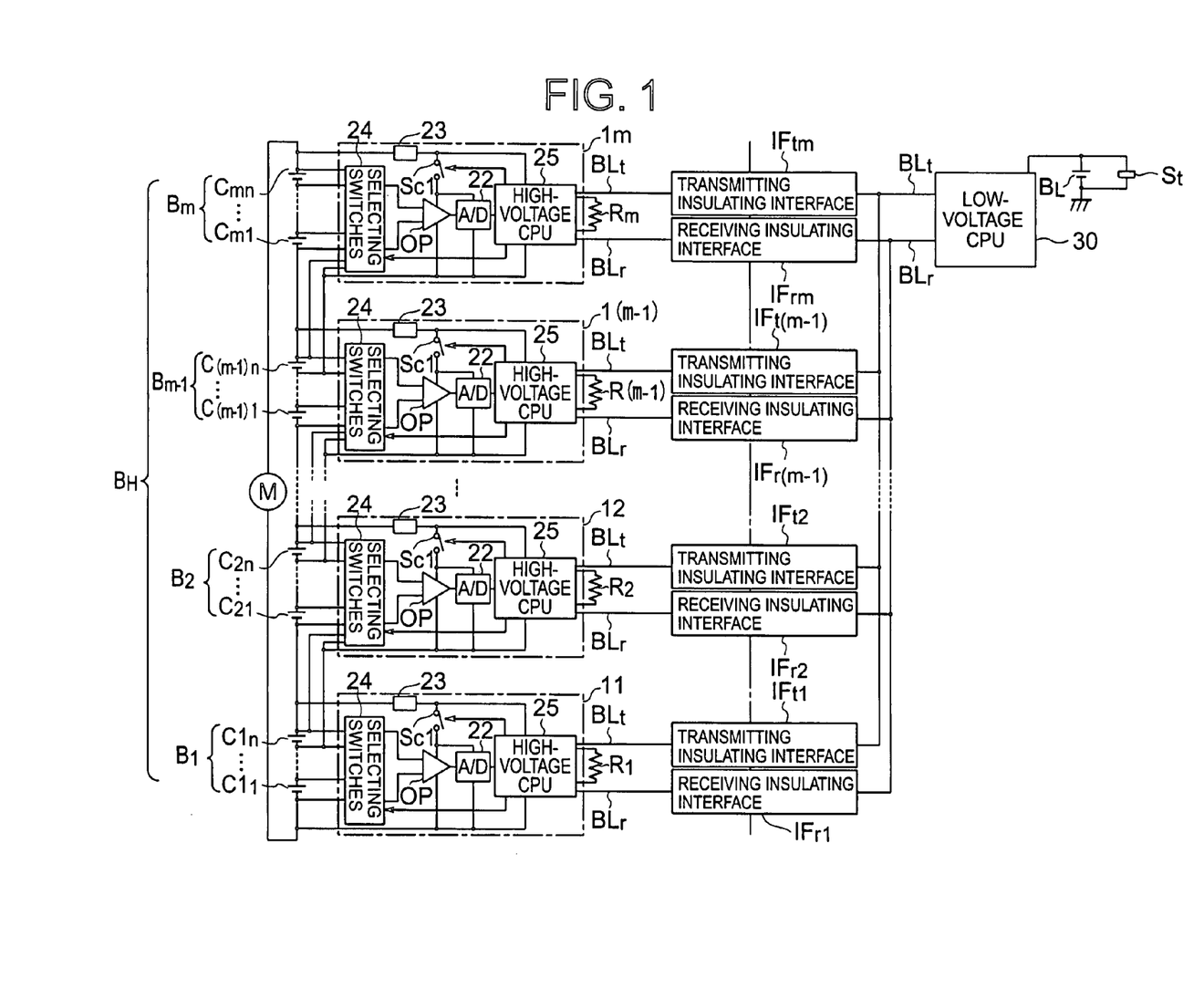
FIG. 1 shows a circuit illustrating a preferred embodiment of a voltage detecting device according to the present invention.

In the following, the preferred embodiments of the present invention will be explained with reference to the attached drawings. FIG. 1 shows a circuit illustrating a preferred embodiment of a voltage detecting device according to the present invention. A reference numeral BL denotes a low-voltage battery. For example, the low-voltage battery BL consists of one secondary battery as shown in FIG. 1. The low-voltage battery BL is used as a drive source of a starter St for starting an engine. An alternator or the like as a battery charger is connected to both ends of the low-voltage battery BL according to a need.

A reference numeral BH in FIG. 1 denotes a high-voltage battery. In a HEV which uses both an engine and an electric motor M as a traveling drive source, the high-voltage battery BH is used as an electric source of the electric motor M. The electric motor M as a load is connected to both ends of the high-voltage battery BH according to a need. An alternator (not shown in the figure) or the like as a battery charger is also connected to both ends of the high-voltage battery BH according to a need.

The high-voltage battery BH is divided into a plurality of blocks B1-Bm (m being integer). Each block of the blocks B1-Bm consists of n secondary batteries (n being integer) C11-Cmn. The secondary batteries C11-Cmn, each of which supplies the same voltage and current, are connected in series. The secondary batteries C1n, C2n, - - -, C(m−1)n, each of which is located at a boundary between one block and another block adjacent to the one block, is selected to be a common secondary battery, a voltage of which is detectable by both two voltage detecting circuits 11-1m assigned to the one block and the other block adjacent to the one block, respectively. That is, for example, the common secondary battery C1n is connected to the voltage detecting circuits 11 and 12, the common secondary battery C2n is connected to the voltage detecting circuits 12 and 13, and the common secondary battery C(m−1)n is connected to the voltage detecting circuits 1(m−1) and 1m.

The voltage detecting device includes the voltage detecting circuits 11-1m as the voltage detector, a low-voltage CPU 30 as the controller transmitting interfaces IFt1-IFtm, and receiving interfaces IFr1-IFrm. FIG. 1 shows that each the common secondary batteries C1n . . . C(m−1)n is directly connected by wires to selecting switches 24, which are discussed below.

The voltage detecting circuits 11-1m are provided corresponding to the blocks B1-Bm, respectively. The voltage detecting circuits 11-1m receive power supply from the respective secondary batteries C11-Cmn that construct the respective blocks B1-Bm. That is, the voltage detecting circuits 11-1m have respective ground level on a minus side of the respective blocks B1-Bm and have the ground level different from one another. Thereby, a withstanding voltage of an element constituting each of the voltage detecting circuits 11-1m can be reduced.

Each of the voltage detecting circuits 11-1m includes a differential amplifier OP for detecting a voltage of the secondary batteries C11-Cmn, a group of selecting switches 24 for connecting both ends of one of the secondary batteries C11-Cmn that constitute the respective blocks B1-Bm to the differential amplifier OP, an A/D converter 22 for digitally converting a voltage detected by the differential amplifier OP, and a high-voltage CPU 25 for controlling the group of the selecting switches 24. The group of the selecting switches 24 is composed of normally closed switches provided at both ends of the secondary batteries C11-Cmn.

Each of the voltage detecting circuits 11-1m further includes: a high-voltage power supply circuit 23 for outputting a constant voltage as a driving power supply of the differential amplifier OP, A/D converter 22 and high-voltage CPU 25 from a supplied voltage of the corresponding block B1-Bm; and breaker switch Sc1 provided between the high-voltage power supply circuit 23 and the differential amplifier OP & A/D converter 22. The high-voltage CPU 25 controls an on/off action of the breaker switch Sc1.

Each of the voltage detecting circuits 11-1m is constructed in one chip. Each of the voltage detecting circuits 11-1m is connected to a corresponding external resistance R1-Rm. Each of the external resistances R1-Rm corresponds to an address of the corresponding block B1-Bm. The external resistances R1-Rm have different resistance values from one another. A resistance value of each of the external resistances R1-Rm is read by the high-voltage CPU 25 in response to a power supply supplied from the high-voltage power supply circuit 23 and stores the resistance value as the address of the high-voltage CPU 25 in a storing means (not shown in the figure).

The low-voltage CPU 30 acts by receiving a power supply from the low-voltage battery BL so as to control the voltage detecting circuits 11-1m and to perform detection and correction of a detection error between the voltage detecting circuits.

A transmitting bus line BLt and receiving bus line BLr are provided between the voltage detecting circuits 11-1m and the low-voltage CPU 30. Each of the transmitting bus line BLt and the receiving bus line BLr is provided divergently from the low-voltage CPU 30 toward a plurality of the voltage detecting circuits 11-1m. Each of the diverging transmitting bus line BLt and the receiving bus line BLr is provided with a corresponding transmitting insulating interface IFt1-IFtm and receiving insulating interface IFr1-IFrm, respectively. That is, the diverging points of the transmitting bus line BLt and the receiving bus line BLr are located nearer to the low-voltage CPU 30 than the transmitting insulating interface IFt1-IFtm and the receiving insulating interface IFr1-IFrm are located.

The transmitting insulating interfaces IFt1-IFtm and receiving insulating interfaces IFr1-IFrm connect the respective voltage detecting circuits 11-1m to the low-voltage CPU 30 on an electrically insulated condition. That is, the low-voltage CPU 30 and the voltage detecting circuits 11-1m can transmit and receive information therebetween on an electrically insulated condition by means of the transmitting insulating interfaces IFt1-IFtm and receiving insulating interfaces IFr1-IFrm, thereby maintaining electric insulation between the high-voltage battery BH and the low-voltage battery BL. As the transmitting insulating interfaces IFt1-IFtm and receiving insulating interfaces IFr1-IFrm, for example, an interface having an optical medium such as a photo-coupler consisting of a light-emitting element and light-receiving element and an interface having a magnetic medium such as a magnetic coupler are known.

Figure 2:
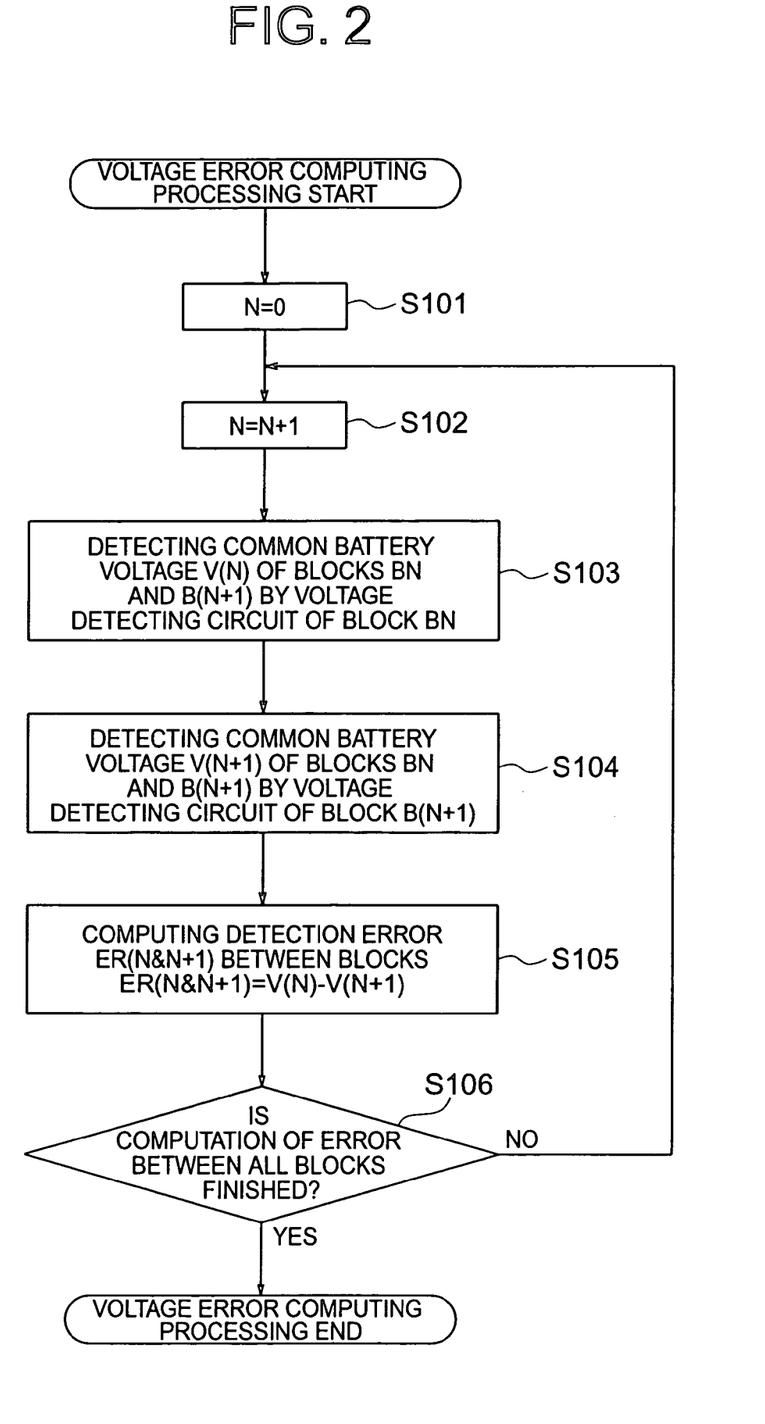
FIG. 2 is a flow chart illustrating a processing sequence for computing a detection error between voltage detecting circuits, to which a low-voltage CPU 30 composing the voltage detecting device shown in FIG. 1 is adjacent.
Figure 3:
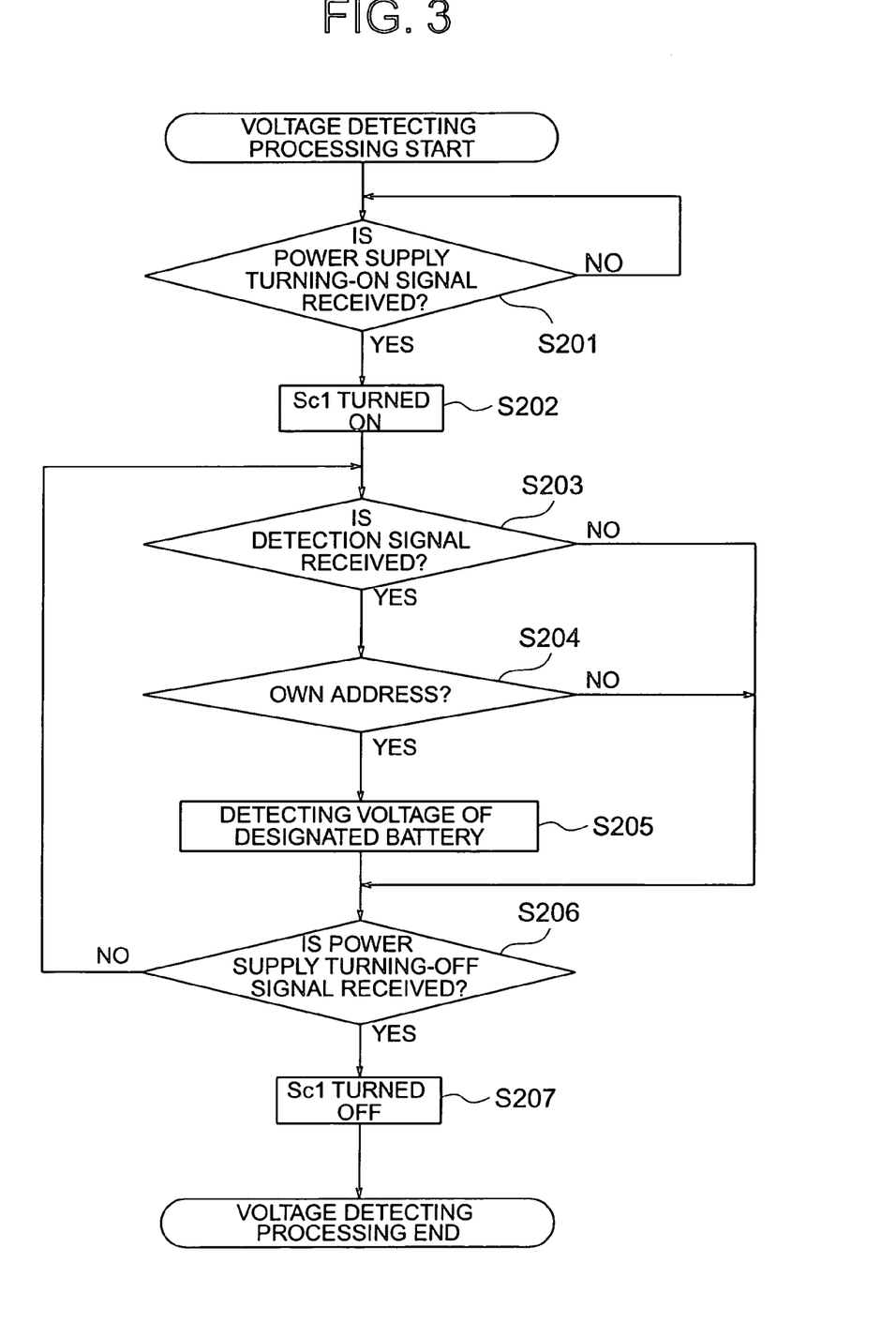
FIG. 3 is a flow chart illustrating a processing sequence in which a high-voltage CPU 25 composing the voltage detecting device shown in FIG. 1 detects a voltage of a secondary battery.
Figure 4:
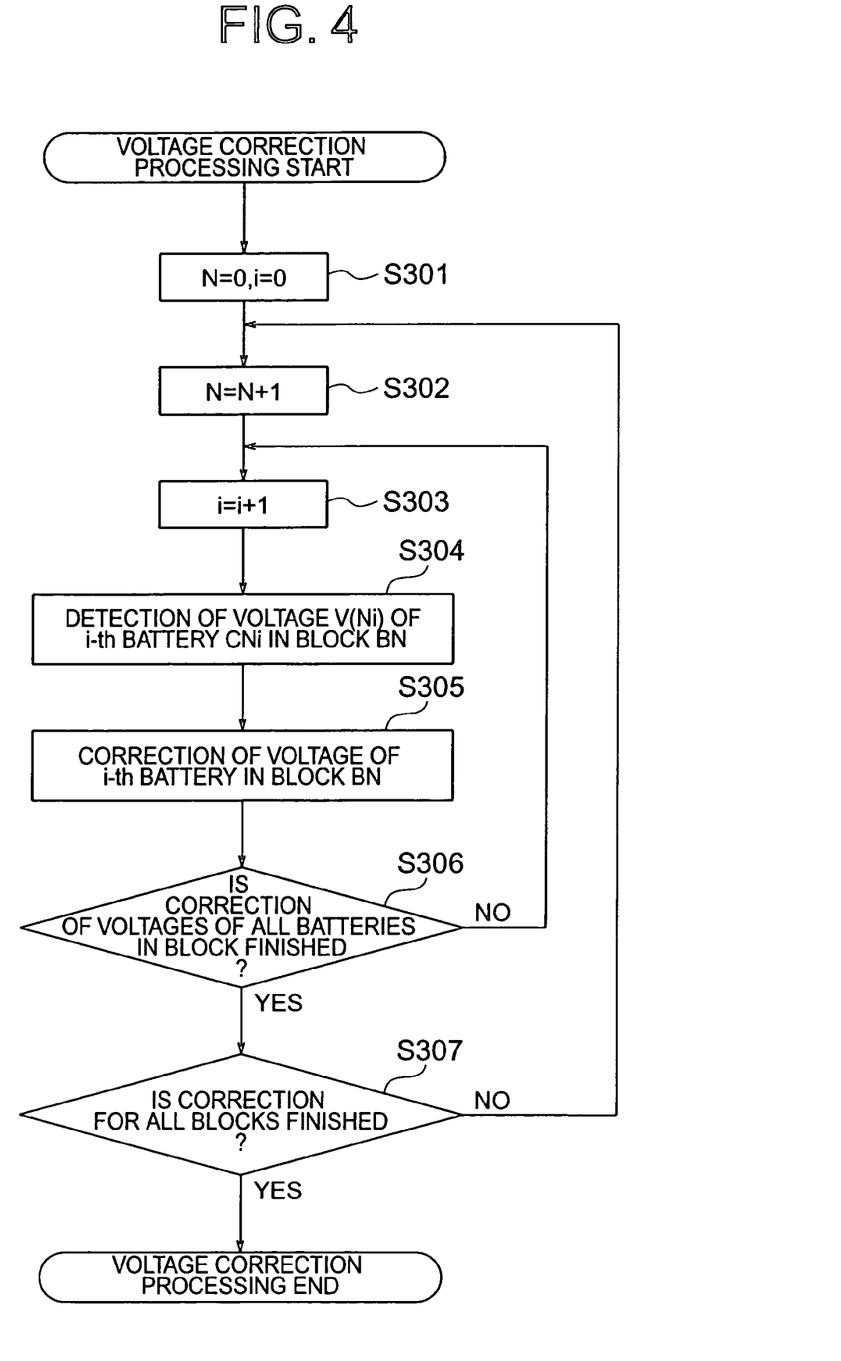
FIG. 4 is a flow chart illustrating a processing sequence for correcting a detection error between voltage detecting circuits, to which a low-voltage CPU 30 composing the voltage detecting device shown in FIG. 1 is adjacent.

FIGS. 2-4 show sequences for computing or correcting a detection error of a voltage of the secondary batteries in each of the voltage detecting circuits 11-1m in the voltage detecting device having the construction described above. Flow charts shown in FIGS. 2-4 are performed in the low-voltage CPU 30 and the high-voltage CPU 25 after an ignition switch of a HEV is turned off. That is, a flow chart shown in FIG. 2 is performed in the low-voltage CPU 30 so as to compute a detection error between two voltage detecting circuits, which are different from each other, from detected voltage values of a common secondary battery shared by the two voltage detecting circuits and further, a flow chart shown in FIG. 4 is performed in the low-voltage CPU 30 so as to perform a correction on the basis of the detection error between the two voltage detecting circuits computed through the flow chart shown in FIG. 2. In the high-voltage CPU 25, a flow chart shown in FIG. 3 is performed so as to detect a voltage of the common secondary battery.

A sequence shown in FIG. 2 for computing a detection error of a voltage between two voltage detecting circuits adjacent to each other is explained below. At step S101, a parameter N indicating a block number is reset to be zero, then we advance to step S102. In this specification, the detection error of the voltage among the voltage detecting circuits mainly means an error due to dispersion in a characteristic per each of the voltage detecting circuits 11-1m.

At step S102, 1 is added to the parameter N, then we advance to step S103. The N becomes 1 when we advance from step S101. In this case, hereafter, subsequent steps are performed with respect to the voltage detecting circuits 11 and 12, which correspond to the blocks B1 and B2, respectively.

At step S103, the voltage detecting circuit 11 as the first voltage detecting circuit is caused to detect a voltage V(1) of a common secondary battery C1n, which is shared by the voltage detecting circuit 11 corresponding to the block B1 and the voltage detecting circuit 12 corresponding to the block B2, then we advance to step S104.

At step S104, the voltage detecting circuit 12 as the second voltage detecting circuit is caused to detect a voltage V(2) of a common secondary battery C1n, which is shared by the voltage detecting circuit 11 corresponding to the block B1 and the voltage detecting circuit 12 corresponding to the block B2, and we advance to step S105.

At step S105, a detection error ER(1&2) between the voltage detecting circuit 11 and the voltage detecting circuit 12 is computed, then we advance to step S106. The detection error ER(1&2) is computed by subtracting the voltage V(2) detected by the voltage detecting circuit 12 at step S104 from the voltage V(1) detected by the voltage detecting circuit 11 at step S103.

At step S106, it is judged whether or not the detection errors between the two voltage detecting circuits as to all of the pairs of the two voltage detecting circuits (i.e. up to the detection error between the voltage detecting circuit 1(m-1) of the block B(m-1) and the voltage detecting circuit 1m of the block Bm) are computed. Then, if judged computed (i.e. YES), we finish the processing of the flow chart. On the other hand, if judged not computed (i.e. NO), we return to step S102.

If N equals to 1 when we return to step S102 after step S106, then N is set to be 2 and then, the detection error between the voltage detecting circuit 12 of the block B2 and the voltage detecting circuit 13 of the block B3 is computed. That is, steps S102-S106 are repeated until N becomes m-1 (i.e. until a computation of the detection error between the voltage detecting circuit 1(m-1) of the block B(m-1) and the voltage detecting circuit 1m of the block Bm being completed).

A sequence of the processing that each high-voltage CPU 25 of the corresponding voltage detecting circuit 11-1m performs when a voltage of the secondary battery is detected at steps S103 and S104 in the flow chart shown on FIG. 2 will be explained with reference to a flow chart shown in FIG. 3.

At step S201, it is judged whether or not a power supply turning-on signal, which is transmitted from the low-voltage CPU 30 to each of the voltage detecting circuits 11-1m through the transmitting bus line BLt and the transmitting interfaces IFt1-IFtm, is received. Then, if judged received (i.e. YES), we advance to step S202. On the other hand, if judged not received (i.e. NO), the judgment is repeated until the signal is received.

At step S202, the breaker switch Sc1 of each of the voltage detecting circuits 11-1m is turned on. Thereby, electric power is supplied from the corresponding block B1-Bm to the differential amplifier OP and A/D converter 22, which constitute the corresponding voltage detecting circuit 11-1m.

At step S203, it is judged whether or not a detection signal, which is transmitted from the low-voltage CPU 30 to each of the voltage detecting circuits 11-1m through the transmitting bus line BLt and the transmitting interfaces IFt1-IFtm, is received. Then, if judged received (i.e. YES), we advance to step S204. On the other hand, if judged not received (i.e. NO), we advance to step S206.

At step S204, it is judged whether or not an address designated by the detection signal received at step S203 is own address. Then, if judged own address, we advance to step S205. On the other hand, if judges not own address, we advance to step S206.

At step S205, a voltage of the secondary battery designated by the low-voltage CPU 30 is detected. (At steps S103 and S104 in the flow chart shown in FIG. 2, the common secondary battery, which is connected to the two voltage detecting circuits adjacent to each other, is designated.) The detection of a voltage of the secondary battery will be explained below as to the common secondary battery C1n between the two voltage detecting circuits 11 and 12 adjacent to each other, as an example. The high-voltage CPU 25 connects both ends of the common secondary battery C1n to the differential amplifier OP. Thereby, a digital value of the voltage of the common secondary battery C1n is supplied from the A/D converter 22 to the high-voltage CPU 25. In response to this, the high-voltage CPU 25 transmits the digital value of the voltage of the common secondary battery C1n, to which its own address is designated, to the receiving interface IFr1. The digital value of the voltage of the common secondary battery C1n transmitted to the receiving interface IFr1 is transmitted to the low-voltage CPU 30 through the receiving bus line BLr.

At step S206, it is judged whether or not a power supply turning-off signal, which is transmitted from the low-voltage CPU 30 to each of the voltage detecting circuits 11-1m through the transmitting bus line BLt and the transmitting interfaces IFt1-IFtm, is received. Then, if judged received (i.e. YES), we advance to step S207. On the other hand, if judged not received (i.e. NO), we return to step S203.

At step S207, the breaker switch Sc1 of each of the voltage detecting circuits 11-1m is turned off. Thereby, electric power from the corresponding block B1-Bm to the differential amplifier OP and A/D converter 22, which constitute the corresponding voltage detecting circuit 11-1m, is shut off.

In the following, a sequence for correcting a value detected by each voltage detecting circuit on the basis of the detection error (of a voltage detected by the voltage detecting circuits of the adjacent blocks) computed according to the flow chart shown in FIG. 2 will be explained with reference to FIG. 4.

At step S301, the parameter N indicating a block number is reset to be zero and a parameter i indicating a secondary battery number within a block is reset to be zero, then we advance to step S302.

At step S302, 1 is added to the parameter N, then we advance to step S303. The N becomes 1 when we advance from step S301. In this case, hereafter, subsequent steps are performed with respect to the voltage detecting circuits 11 which corresponds to the block B1.

At step S303, 1 is added to the parameter i, then we advance to step S304. The i becomes 1 when we advance to steps S301 and S302. In this case, hereafter, subsequent steps are performed with respect to the secondary battery C11 of the block B1 together with a result at step S302.

At step S304, a voltage of the i-th secondary battery CNi in the block BN is detected and we advance to step S305. The voltage detection is carried out according to the flow chart shown in FIG. 3, similarly to the voltage detection processing as to a voltage by the two voltage detecting circuits which are different from each other.

At step S305, the voltage value of the secondary battery detected at step S304 is corrected, then we advance to step S306. For example, if a relative error of the other voltage detecting circuit is to be corrected on the basis of the voltage detecting circuit 11 (as the first voltage detecting circuit) of the block B1, as for the voltage detecting circuit 12, the detection error ER(1&2) between the voltage detecting circuit 11 and voltage detecting circuit 12 is added to a voltage value of the secondary battery in the block B2 detected by the voltage detecting circuit 12. As for the voltage detecting circuit 13, the detection error ER(1&2) between the voltage detecting circuit 11 and voltage detecting circuit 12 and the detection error ER(2&3) between the voltage detecting circuit 12 and voltage detecting circuit 13 are added to a voltage value of the secondary battery in the block B3 detected by the voltage detecting circuit 13. As for the voltage detecting circuit 1m, the sum of all the detection errors ER(1&2)–ER((m−1)&m) between the respective adjacent two voltage detecting circuits are added to a voltage value of the secondary battery in the block Bm detected by the voltage detecting circuit 1m. Thus, a relative error of each of the voltage detecting circuits 11-1m can be corrected on the basis of the first voltage detecting circuit (that is, having the first voltage detecting circuit as a reference).

Further, if a relative error of the other voltage detecting circuit is to be corrected on the basis of the voltage detecting circuit 1m (as the second voltage detecting circuit) of the block Bm, as for the voltage detecting circuit 1(m−1), the detection error ER((m−1)&m) between the voltage detecting circuit 1(m−1) of the block B(m−1) and voltage detecting circuit 1m of the block Bm is subtracted from a voltage value of the secondary battery in the block B(m−1) detected by the voltage detecting circuit 1(m−1). As for the voltage detecting circuit 11, the sum of all the detection errors ER((m−1)&m)–ER(1&2) between the respective adjacent two voltage detecting circuits are subtracted from a voltage value of the secondary battery in the block B1 detected by the voltage detecting circuit 11. Thus, a relative error of each of the voltage detecting circuits 11-1m can be corrected on the basis of the second voltage detecting circuit (that is, having the second voltage detecting circuit as a reference).

For example, when the detection error ER(1&2) between the voltage detecting circuit 11 and the voltage detecting circuit 12 is −0.1 V, if the voltage detecting circuit 11 (as the first voltage detecting circuit) is selected as a reference, −0.1 V is added to a voltage value detected by the voltage detecting circuit 12. That is, 0.1 V is subtracted from a voltage value detected by the voltage detecting circuit 12. Further, if the voltage detecting circuit 12 (as the second voltage detecting circuit) is selected as a reference, −0.1 V is subtracted from a voltage value detected by the voltage detecting circuit 11. That is, 0.1 V is added to a voltage value detected by the voltage detecting circuit 11.

At step S306, it is judged whether or not the correction of the voltage values of all the secondary batteries in a block is completed. Then, if judged completed (i.e. YES), we advance to step S307. On the other hand, if judges not completed (i.e. NO), we return to step S303 in order to perform a correction of a next secondary battery.

At step S307, it is judged whether or not the correction of the voltage values of the secondary batteries in all blocks is completed. Then, if judged completed (i.e. YES), we finish the processing of the flow chart. On the other hand, if judges not completed (i.e. NO), we return to step S302 in order to perform a correction of a next block.

With the construction of the voltage detecting device described above, a voltage of the same secondary battery is detected by the adjacent voltage detecting circuits. For example, the voltage detecting circuits 11 and 12 detect a voltage of the secondary battery C1n and in the low-voltage CPU 30, a voltage value detected by the voltage detecting circuit 12 is subtracted from a voltage value detected by the voltage detecting circuit 11 so as to compute a detection error between the adjacent two voltage detecting circuits. Then, if the voltage detecting circuit 11 is selected as a reference, the computed detection error is added to a voltage value of each secondary battery in the block B2 detected by the voltage detecting circuit 12, thereby correcting the relative error between the adjacent voltage detecting circuits 11 and 12. That is, since the relative errors among the voltage detecting circuits 11-1m are computed and the errors can be corrected, therefore even if the high-voltage power supply circuit 23 and A/D converter 22 are not so highly precise, an equalizing error of each secondary battery can be removed with a low cost and therefore, each secondary battery can be used efficiently.

Further, with the construction of the voltage detecting device described above, the low-voltage CPU 30 causes the voltage detecting circuits 11 and 12 to detect a voltage of the common secondary battery C1n, the voltage being detectable by both the voltage detecting circuits 11 and 12, and in the low-voltage CPU 30, a voltage value detected by the voltage detecting circuit 12 is subtracted from a voltage value detected by the voltage detecting circuit 11 so as to compute a detection error between the voltage detecting circuits 11 and 12 adjacent to each other. That is, since a voltage of the same secondary battery is detected by the two different voltage detecting circuits, therefore the detection error between the voltage detecting circuits can be easily computed.

Further, with the construction of the voltage detecting device described above, the low-voltage CPU 30 adds the detection error between the voltage detecting circuits 11 and 12 to a voltage value of the secondary batteries C21-C2n of the block B2 detected by the voltage detecting circuit 12, thereby the correction of a value detected by the voltage detecting circuit 12 can be carried out having the voltage detecting circuit 11 (as the first voltage detecting circuit) as a reference (that is, on the basis of the voltage detecting circuit 11).

Further, with the construction of the voltage detecting device described above, the low-voltage CPU 30 subtracts the detection error between the voltage detecting circuits 11 and 12 from a voltage value of the secondary batteries C11-C1n of the block B1 detected by the voltage detecting circuit 11, thereby the correction of a value detected by the voltage detecting circuit 11 can be carried out having the voltage detecting circuit 12 (as the second voltage detecting circuit) as a reference (that is, on the basis of the voltage detecting circuit 12).

In the preferred embodiment described above, the common secondary batteries, a voltage of each of which is detectable by both two different voltage detecting circuits, are set to be C1n, C2n, - - -, C(m−1)n and Cmn, each of which is located at a boundary between the adjacent two blocks. However, instead, the common secondary batteries may be set to be C21, - - -, C(m−1)1 and Cm1. Moreover, the common secondary is battery is not necessarily located at a boundary between the adjacent two blocks. Instead, the common secondary battery may be any one of secondary batteries included in the corresponding block provided that a voltage of the common secondary battery is detectable by two different voltage detecting circuits.

In the preferred embodiment described above, the low-voltage CPU 30 performs the correction of a voltage of the secondary battery. However, instead, the low-voltage CPU 30 may compute the detection error between the reference voltage detecting circuit and the other voltage detecting circuit on the basis of the computed detection error between the adjacent voltage detecting circuits and a value of the detection error may be transmitted to the high-voltage CPU 25 of each voltage detecting circuit, so that a voltage value of each secondary battery can be corrected on the side of the voltage detecting circuit.

In the preferred embodiment described above, the number of the secondary battery shared by the different voltage detecting circuits is set to be one. However, instead, this number may be plural. Further, in the preferred embodiment described above, the high-voltage battery is composed of electric cells each being consisting of a secondary battery. However, instead, the high-voltage battery may be composed of unit batteries or unit cells each being consisting of a secondary battery.

Among the voltage detecting circuits, highly precise power supply circuit and A/D converter may be used only for the reference voltage detecting circuit. Alternatively, a correction value of the detection error is in advance computed only for the reference voltage detecting circuit and is stored in the low-voltage CPU 30, so that upon correction of a voltage value detected by the other voltage detecting circuit, the correction value of the detection error of the reference voltage detecting circuit together with the detection error between the adjacent voltage detecting circuits is added to the voltage value detected by the other voltage detecting circuit. As a result, the accuracy of the voltage value detected by the reference voltage detecting circuit is improved, therefore the accuracy of the voltage detected by the other voltage detecting circuit corrected by computing the relative error can be also improved.

The aforementioned preferred embodiments are described to aid in understanding the present invention and variations may be made by one skilled in the art without departing from the spirit and scope of the present invention.

What is claimed is:

1. A voltage detecting device for an on-vehicle high-voltage battery in which a plurality of secondary batteries are connected in series, the on-vehicle high-voltage battery being divided into a plurality of blocks each including at least one secondary battery, the voltage detecting device comprising:
a plurality of voltage detectors each assigned to a respective individual block for detecting a voltage of each secondary battery included in the respective block; and
a controller for controlling the plurality of voltage detectors;
wherein a common secondary battery is selected from a plurality of the secondary batteries, a voltage of the common secondary battery being measurable by a first one of the voltage detectors which is assigned to the respective block containing the common secondary battery, and also being measurable by a second one of the voltage detectors which is assigned to a different one of the blocks that does not contain the common secondary battery; and
wherein the controller causes both of the first and second voltage detectors to measure the voltage of the common secondary battery, computes a detection error between the two voltage detectors on the basis of the detected voltage values of the common secondary battery, and makes corrections in voltage values detected by the two voltage detectors on the basis of the computed detection error.

2. The device according to claim 1, wherein the controller computes the detection error between the two voltage detectors consisting of first and second voltage detectors by subtracting the voltage value of the common secondary battery detected by the second voltage detector from the voltage value of the common secondary battery detected by the first voltage detector.

3. The device according to claim 1, wherein the controller subtracts the detection error between the two voltage detectors from a voltage value of each secondary battery of the block detected by the first voltage detector that is assigned to the block, thereby making corrections in the voltage value of each secondary battery except the common secondary battery detected by the first voltage detector.

4. The device according to claim 2, wherein the controller subtracts the detection error between the two voltage detectors from a voltage value of each secondary battery of the block detected by the first voltage detector that is assigned to the block, thereby making corrections in the voltage value of each secondary battery except the common secondary battery detected by the first voltage detector.

5. The device according to claim 1, wherein the controller adds the detection error between the two voltage detectors to a voltage value of each secondary battery of the block detected by the second voltage detector that is assigned to the block, thereby making corrections in the voltage value of each secondary battery except the common secondary battery detected by the second voltage detector.

6. The device according to claim 2, wherein the controller adds the detection error between the two voltage detectors to a voltage value of each secondary battery of the block detected by the second voltage detectors that is assigned to the block, thereby making corrections in the voltage value of each secondary battery except the common secondary battery detected by the second voltage detector.

7. The device according to claim 1, wherein the common secondary battery is connected by wires to both of the first and second voltage detectors.

8. The device according to claim 7, wherein both of the first and second voltage detectors directly measure the voltage of the common secondary battery.

* * * * *